United States Patent [19]
Omae

[11] Patent Number: 5,724,055
[45] Date of Patent: Mar. 3, 1998

[54] DISPLAY APPARATUS AND METHOD OF MANUFACTURE IN WHICH DISPLAY LUMINANCE CAN BE ADJUSTED

[75] Inventor: Mitsuhiro Omae, Tottori, Japan

[73] Assignees: Sanyo Electric Co., Ltd., Moriguchi; Tottori Sanyo Electric Co., Ltd., Tottori, both of Japan

[21] Appl. No.: 563,488

[22] Filed: Nov. 28, 1995

[30] Foreign Application Priority Data

Nov. 28, 1994 [JP] Japan .................. 6-293454

[51] Int. Cl.⁶ .................................................. G09F 9/00
[52] U.S. Cl. .................. 345/82; 257/88; 257/98; 437/209; 347/130; 313/500
[58] Field of Search .................. 345/82; 347/130, 347/233, 900; 257/88, 98; 313/500, 512; 437/209

[56] References Cited

U.S. PATENT DOCUMENTS

| | | | |
|---|---|---|---|
| 4,455,562 | 6/1984 | Dolan et al. | 347/130 |
| 4,866,430 | 9/1989 | Chek | 345/82 |
| 4,962,375 | 10/1990 | Hirane et al. | 345/82 |
| 4,967,192 | 10/1990 | Hirane et al. | 345/82 X |
| 5,138,310 | 8/1992 | Hirane et al. | 345/82 |
| 5,233,337 | 8/1993 | Takahashi | 345/82 |
| 5,309,151 | 5/1994 | Aoki | 345/82 X |

FOREIGN PATENT DOCUMENTS

| | | |
|---|---|---|
| 62-83640 | 5/1987 | Japan . |
| 3-24359 | 5/1991 | Japan . |

Primary Examiner—Raymond J. Bayerl
Assistant Examiner—Seth D. Vail
Attorney, Agent, or Firm—Nikaido, Marmelstein, Murray & Oram LLP

[57] ABSTRACT

A method for manufacturing a display apparatus including a display device, a circuit device which supplies a driving current to the display device and a selecting circuit for regulating the drive current of the circuit device into a plurality of steps of current values. The display apparatus is manufactured in the following steps: a step of allocating the display device to one of a plurality of ranks according to its light quantity; a step of allocating the circuit device to one of a plurality of ranks according to its output current, and a step of selecting based on the rank of the display device and the rank of the circuit device a selection value of the selecting circuit previously prepared according to a combination of ranks of the display device and the circuit device.

7 Claims, 10 Drawing Sheets

DISPLAY APPARATUS AND METHOD OF MANUFACTURE IN WHICH DISPLAY LUMINANCE CAN BE ADJUSTED

BACKGROUND OF THE INVENTION

1. Field of the Invention

The present invention relates to a display apparatus comprising a light emitting device such as a light emitting diode and a circuit device for driving the light emitting device, and to its manufacturing method.

2. Description of the Prior Art

An example of a display apparatus having a light emitting diode is disclosed in Japanese Laid-open Utility Model Application S62-83640. According to the prior art, a plurality of light emitting diodes and a plurality of circuit devices for driving the light emitting diodes are arranged on a circuit board, and the light emitting diodes and the circuit devices are electrically connected to each other. However, the light quantity of the light emitting diode is not uniform for all the products but varies according to each product. For example, the light quantity varies in a range of ±33% for the average light quantity of 1000 light emitting diodes. On the other hand, the output current of the circuit device also varies in a range of ±27% for the average value of 1000 circuit devices.

Therefore, if a light emitting diode and a circuit device are arbitrarily combined, there is a fair chance that a display apparatus of an inferior display quality is produced. In particular, in a display apparatus where a plurality of light emitting diodes are arranged in a line, the difference in light quantity between adjoining light emitting diodes is conspicuous. For this reason, conventionally, a permissible light quantity variation range is set and light emitting diodes which are outside the range are discarded as inferior products. Likewise, a permissible output current variation range is set and circuit devices which are outside the range are discarded as inferior products. However, this method is unprofitable since the rate of inferior products is high for both the light emitting diode and the circuit device.

SUMMARY OF THE INVENTION

An object of the present invention is to provide a display apparatus in which a variation in luminance is small.

Another object of the present invention is to provide a display apparatus in which luminance is easily adjusted.

A manufacturing method according to the present invention is a method for manufacturing a display apparatus provided with a display device, a circuit device which supplies a driving current to the display device and selecting means for regulating the drive current of the circuit device into a plurality of steps of current values. The method includes the steps of: allocating the display device to one of a plurality of ranks according to its light quantity; allocating the circuit device to one of a plurality of ranks according to its output current; and selecting based on the rank of the display device and the rank of the circuit device a selection value of the selecting means previously prepared according to a combination of ranks of the display device and the circuit device.

BRIEF DESCRIPTION OF THE DRAWINGS

These and other objects and features of this invention will become clear from the following description, taken in conjunction with the preferred embodiments with reference to the accompanied drawings in which.

DESCRIPTION OF THE PREFERRED EMBODIMENTS

Figure 1:
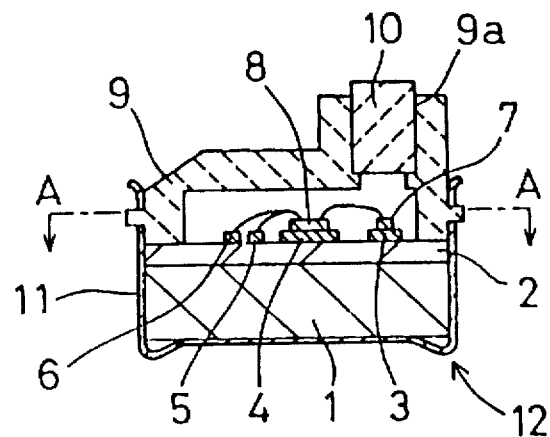
FIG. 1 is a cross-sectional view of a display apparatus according to an embodiment of the present invention.
Figure 2:
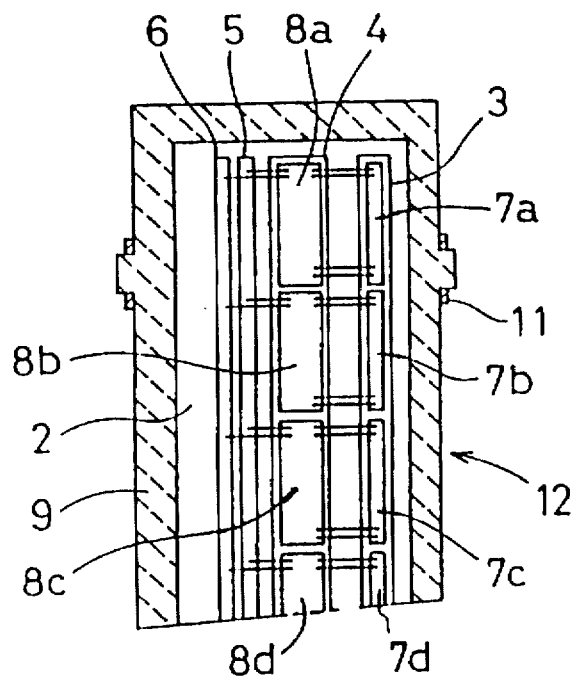
FIG. 2 is a cross-sectional view taken on the line A—A of FIG. 1.

Hereinafter, an embodiment of the present invention will be described with reference to FIGS. 1 and 2. FIG. 1 is a cross-sectional view of a display apparatus according to the embodiment. FIG. 2 is a cross-sectional view taken on the line A—A of FIG. 1. In these figures, a long heat sink 1 is made of, for example, a material such as an extruded aluminum material having a high heat conductivity. Provided on the heat sink 1 is a long substrate 2 which is made of, for example, ceramic-mixed resin. The substrate 2 has conductive patterns 3, 4, 5 and 6 formed on its surface.

A light emitting diode 7 includes, for example, a semiconductor substrate made of gallium arsenide on which an epitaxial layer made of gallium arsenide phosphide is formed. The light emitting diode 7 has a plurality of light emitting portions aligned in a row or in zigzag on its obverse surface. It also has segment electrodes on its obverse surface and common electrodes on its reverse surface. These electrodes are in ohmic contact with the light emitting portions. On the obverse surface of each light emitting diode 7, 64 light emitting portions are aligned at a pitch of, for example, 125 82 m. The light emitting diode 7 measures approximately 8 mm in length, approximately 2 mm in width and approximately 0.35 mm in thickness. As shown in FIG. 2, a plurality of such light emitting diodes 7a, 7b, 7c and 7d are fixed onto the conductive pattern 3 adjacently to each other so as to be aligned along the length of the substrate 2.

A circuit device 8 fixed onto the conductive pattern 4 by an insulating adhesive has its one end electrically connected to the light emitting diode 7 and its other end electrically connected to the conductive patterns 5 and 6 by fine metallic wires. The circuit device 8 is integrated on the semiconductor substrate. A supporter 9 disposed on the circuit board 2 has a through hole 9a formed on its upper part. A lens array 10 fitted in the through hole 9a includes a short focal length rod lens array. A fixing member 11 fixes the heat sink 1, the board 2 and the supporter 9 into a unit. These components constitute a display apparatus 12 of this embodiment.

Figure 3:
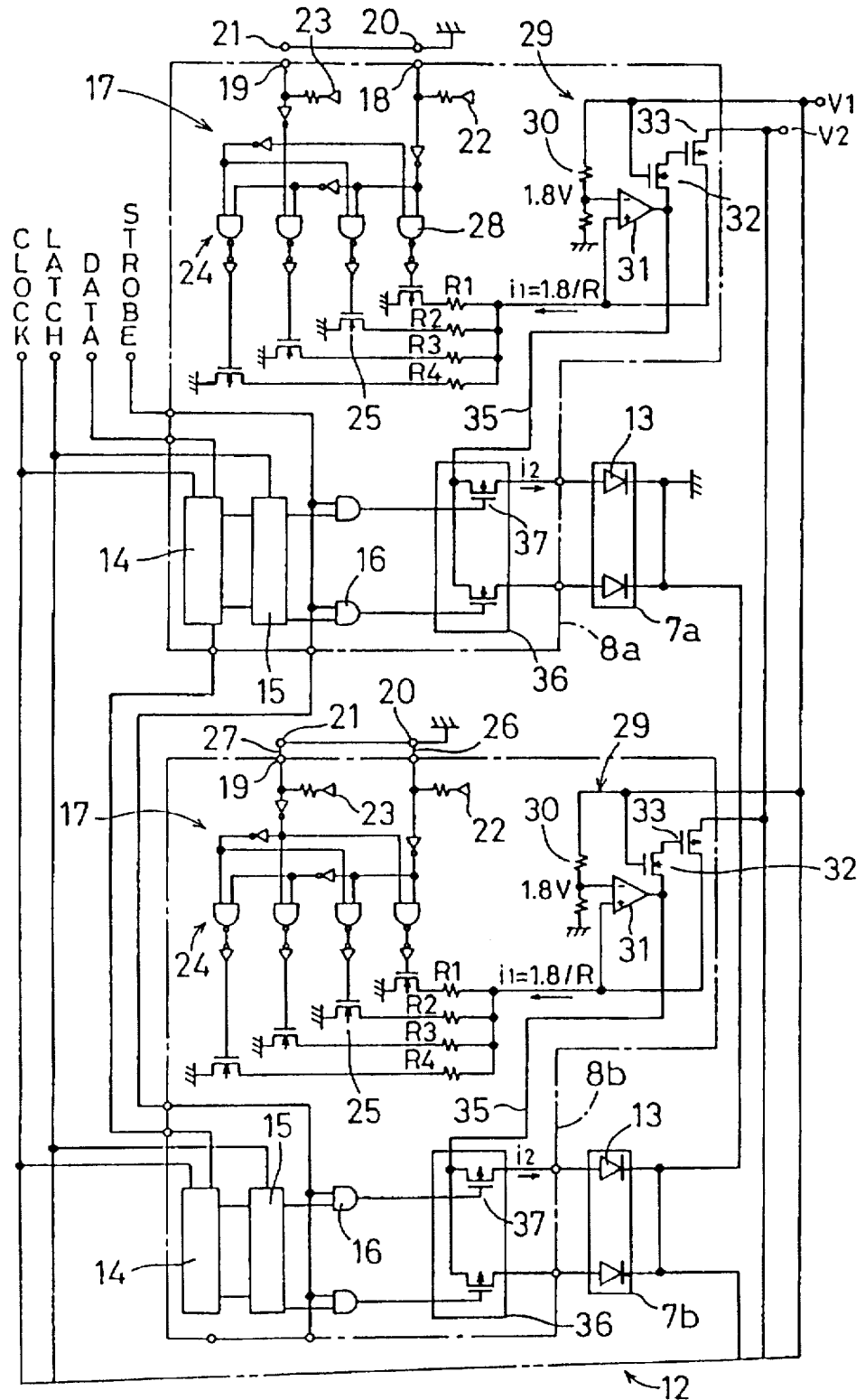
FIG. 3 is a circuit diagram of the display apparatus according to the embodiment of the present invention.

Subsequently, a circuit arrangement of the display apparatus 12 will be described with reference to FIGS. 3 and 4. FIG. 3 shows the light emitting diodes 7a and 7b and the circuit devices 8a and 8b. In this figure, the light emitting diodes 7a and 7b each include a plurality of light emitting portions 13, and the circuit devices 8a and 8b are electrically connected to the light emitting diodes 7a and 7b, respectively. Hereinafter, a block including the light emitting diode 7a and the circuit device 8a will be described with reference to the enlarged view of FIG. 4.

A shift register 14 provided in the circuit device 8a receives data DATA supplied in series, i.e. binary numbers instructing lighting or non-lighting of the light emitting diode 7a and outputs the data in parallel. To the shift register 14 is supplied a clock pulse CLOCK. A latch circuit 15 connected to the shift register 14 latches the parallely outputted data in response to a latch signal LATCH. An AND gate 16 receives data from the latch circuit 15 and a strobe signal STROBE to output a lighting signal. The lighting signal is supplied to a driver circuit 36 to drive the light emitting portions 13 of the light emitting diode 7a.

A selecting circuit 17 includes, for example, two input terminals 18 (ADJ1) and 19 (ADJ2), and terminals 20 and 21 are provided adjacent thereto. The terminals 20 and 21 are both connected to ground. The terminals 20 and 21 are provided on a circuit board 2. To the input terminals 18 and 19 are connected voltage setting circuits 22 and 23 through resistors R10 and R11. The voltage setting circuits 22 and 23 supply direct current (DC) voltages. The input terminal 18 and the terminal 20, and the input terminal 19 and the terminal 21 are connectable by fine metallic wires. However, whether they are connected or not is determined in view of the light quantity characteristic of the light emitting diode 7a and the output current characteristic of the circuit device 8a to be combined with the light emitting diode 7a.

To the input terminals 18 and 19 is connected a logic circuit 24. The logic circuit 24 includes invertors 40 to 43 connected as shown in the figure, four NAND gates 28a to 28d and invertors 44a to 44d connected to the output terminals of the NAND gates 28a to 28d. The invertors 44a to 44d have their output terminals connected to the gates of N-channel metal oxide semiconductor (MOS) transistors 25a to 25d. The transistors 25a to 25d have their sources connected to ground and have their drains connected to a current supplying circuit 29 through resistors R1 to R4.

The current supplying circuit 29 includes an operational amplifier 31, a voltage dividing circuit 30 which supplies a reference voltage to the operational amplifier 31, an N-channel MOS transistor 32 and a p-channel MOS transistor 33. The voltage dividing circuit 30 divides a DC voltage V1 with two resistors to generate a reference voltage Vref of 1.8 V at a node 45. The reference voltage Vref is applied to an inverting terminal (−) of the amplifier 31. The voltage of a non-inverting terminal (+) of the amplifier 31 is automatically controlled to be 1.8 V which is the same as the reference voltage Vref. As a result, when a resistor selected by the logic circuit 24 from among the resistors R1 to R4 has a resistance R, a current $i_1=1.8/R$ flows from a power source V2 into the selected resistor through the transistor 33. Since the values of the resistors R1, R2, R3 and R4 are different from one another, the current $i_1$ varies according to which resistor is selected. The values of the resistors R1, R2, R3 and R4 are respectively set to 94%, 192%, 143% and 85% of the standard value.

A current $i_2$ (output current of the current supplying circuit 29) flowing into the transistor 32 is in a predetermined proportional relationship with the current $i_1$ and varies according to which of the resistors R1 to R4 is selected. The output current $i_2$ is supplied to the driver circuit 36. The current $i_2$ flows uniformly into activated ones of the transistors 37 of the driver circuit 36 and further flows into ground by way of the light emitting portions 13 corresponding to the activated transistors. The light emitting portions 13 are lit into which the current $i_2$ flows.

Which light emitting portions are lit depends on the shift register 14, the latch circuit 15 and the AND gate 16. The quantity of the current flowing into the light emitting portions 13 depends on the selecting circuit 17, the logic circuit 24, the resistors R1 to R4 and the current supplying circuit 29.

Figure 4:
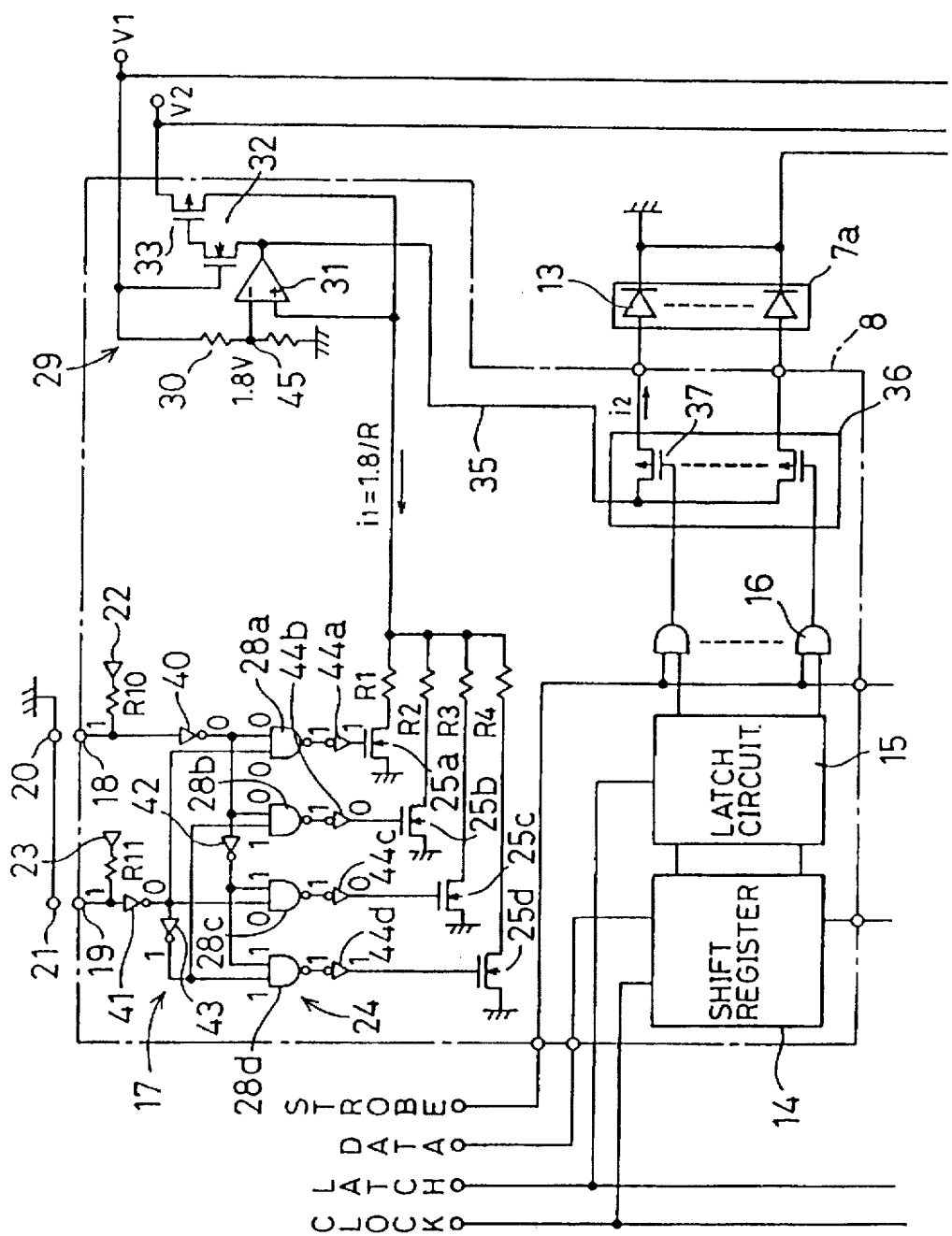
FIG. 4 is a partial enlarged view of FIG. 3.
Figure 5:
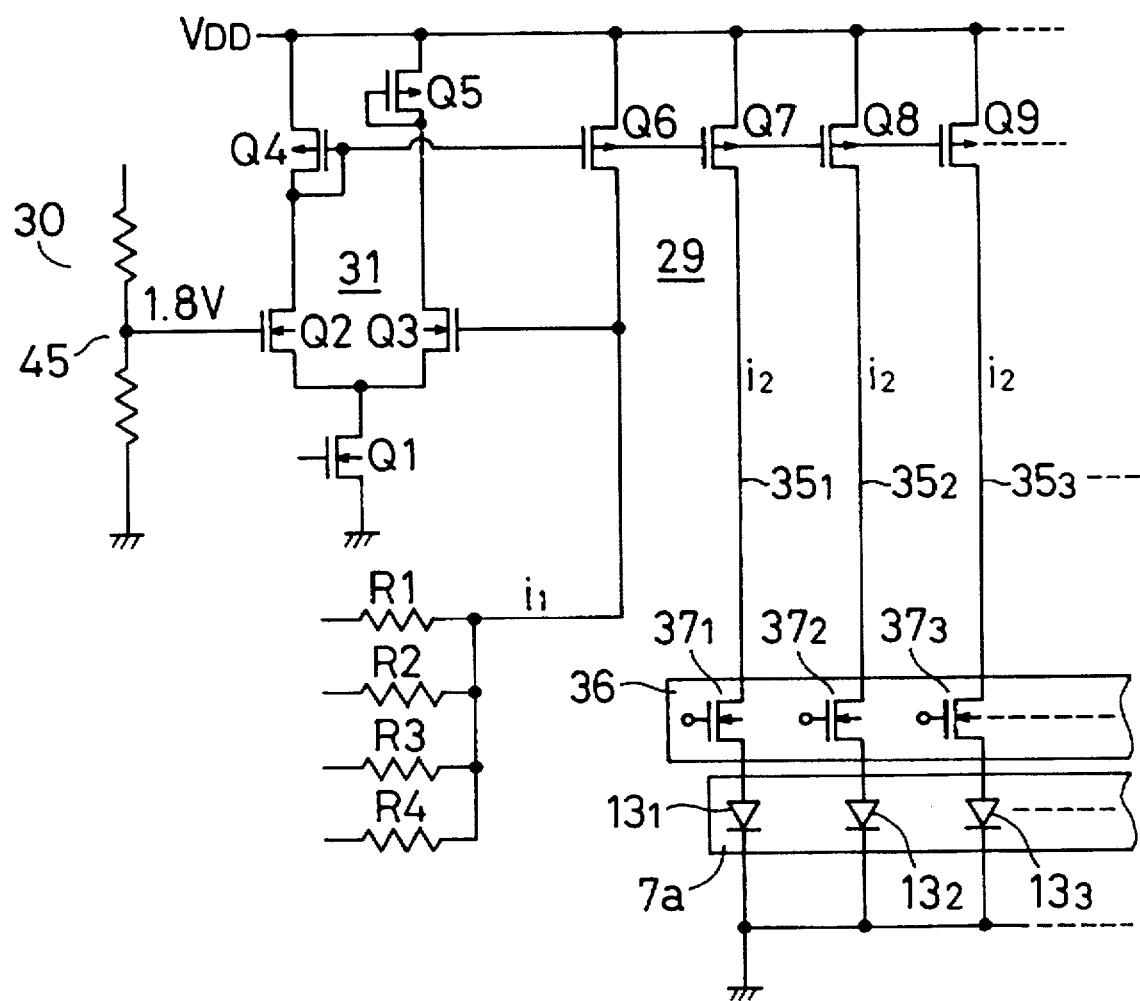
FIG. 5 is a circuit diagram showing a partial modification of FIG. 4.

When the number of light emitting portions 13 in the light emitting diode 7a is great such as 64, since the value of the current flowing into the light emitting portions 13 may vary according to the number of light emitting portions 13 that are lit, the current supplying circuit 29 is designed to separately supply the current to the light emitting portions as shown in FIG. 5. In FIG. 5, transistors Q1 to Q5 constitute the amplifier 31. The output current $i_2$ of the current supplying circuit 29 is supplied from transistors Q7, Q8, Q9, . . . by way of output lines $35_1$, $35_2$, $35_3$, . . . to transistors $37_1$, $37_2$, $37_3$ of the driver circuit 36. The ON/OFF of the transistors $37_1$, $37_2$, $37_3$, . . . is controlled by an output of the AND gate 16 of FIG. 4.

In the selecting circuit 17, when the input terminals 18 and 19 are not connected to the terminals 20 and 21 (not connected to ground) as shown in FIG. 4, the transistors 25a to 25c are OFF and the transistor 25d is ON, so that the resistor R4 is selected. When the input terminals 18 and 19 are connected to the terminals 20 and 21 as in the circuit device 8b shown in the lower half of FIG. 3, the resistor R1 is selected.

When the input terminal 18 is connected to the terminal 20 but the input terminal 19 is not connected to the terminal 21, the resistor R2 is selected. When the input terminal 18 is not connected to the terminal 20 but the input terminal 19 is connected to the terminal 21, the resistor R3 is selected.

As described later, in completing the display apparatus (i.e. in manufacturing the display apparatus), the condition of the connection between the input terminals 18 and 19 and the terminals 20 and 21 is selected in view of the characteristic of the light emitting diode to be connected to the circuit device 8a and the characteristic of the circuit device 8a. In that case, although not limited thereto, a jumper wire is used for the connection.

prior to such a final selection, the characteristics of the light emitting diodes 7 and the circuit devices 8 are separately measured. In the measurements, the connection as shown in FIGS. 3 and 4 is not made between the circuit device 8a and the light emitting diode 7a. The light emission characteristic of the light emitting diode 7 is measured with an apparatus exclusively used therefor. The characteristic of the circuit device 8 is measured by measuring with an ammeter a current outputted from the driver circuit 36 when a resistor, for example, R4 serving as a reference is activated.

Figure 6:
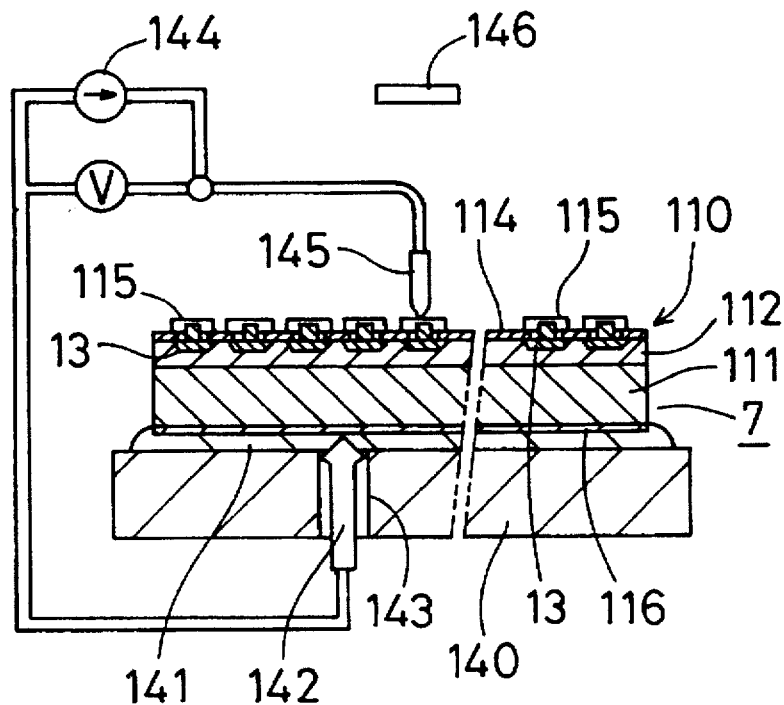
FIG. 6 shows a light quantity measuring apparatus for a light emitting diode.

Now, a method for measuring the characteristic of the light emitting diode 7 will be described with reference to FIG. 6. FIG. 6 shows the light emitting diode 7 in a condition before it is cut out from a semiconductor wafer 110 as a pellet. On a semiconductor substrate 111 made of N-type gallium arsenide, an epitaxial layer 112 made of N-type gallium arsenide phosphide is formed by a method such as vapor epitaxial growth. The light emitting regions (light emitting portions) 13 formed on the surface of the epitaxial layer 112 by selective diffusion are p-type regions to which zinc is added. An insulating layer 114 formed on the epitaxial layer 112 is made of, for example, silicon dioxide and has windows for the light emitting regions 13. An obverse electrode 115 is made of aluminum and the like and has its one end in ohmic contact with the light emitting regions 13 in the windows of the insulating layer 114 and its other end formed on the insulating layer 114. A reverse electrode 116 formed on the reverse surface of the semiconductor substrate 111 is a thin film made of gold and the like.

The wafer 110 is fixed onto a base 140 such as a metal substrate or a silicon substrate having a lubricant surface by a conductive adhesive or wax 141 and is brought into contact with the reverse electrode 116 by connecting a reverse electrode terminal 142 to the conductive adhesive or by inserting it into a through hole 143 previously formed in the base 140. Then, from a constant current source 144 having its one end connected to the obverse electrode 115, a constant current is supplied by way of a scanning terminal 145 to the obverse electrode 115 to light the light emitting regions 13 successively or in blocks. On the other hand, a light receiver 146 is moved so as to be located directly above each light emitting region 13 to measure the light quantity of each light emitting region 13. The light quantity is stored in a digital format corresponding to data of an arranged position of the light emitting region 13, for example, in a data file.

Figure 7:
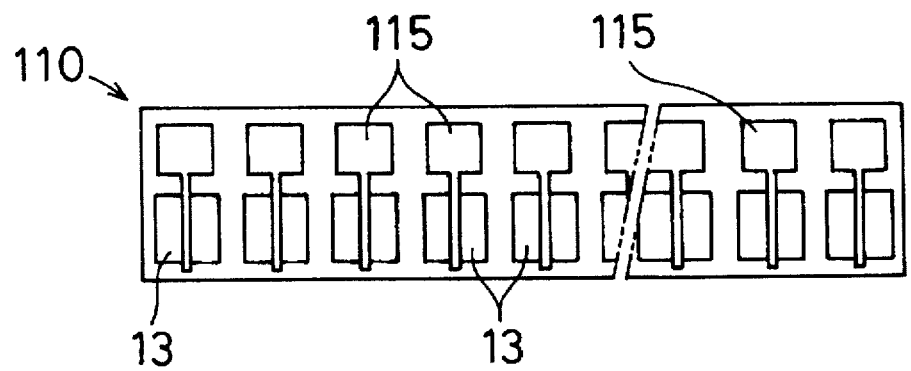
FIG. 7 is a plan view of a light emitting diode.

In such a light quantity measurement, when one light emitting region 13 is cut out as one wafer 110, the results of the light quantity measurement are used as they are. However, when cutting is performed so that one pellet includes a plurality of light emitting regions 13 to form a light emitting diode array like the light emitting diode 7 of this embodiment, the light quantity of a specific light emitting region in the pellet is used or the average light quantity of the light emitting regions included in the pellet is used. For example, as shown in FIG. 7, when an array of the light emitting regions 13 is positioned in the lateral direction of the figure and 64 consecutive regions form one pellet (light emitting diode 7), the average of the light quantities of the 64 light emitting regions 13 is preferably stored as the light quantity of the light emitting diode (pellet).

In measuring the characteristic of the circuit device 8, the currents are measured one by one which are outputted from all the output terminals of the circuit device under a condition where a standard current is generated from the current supplying circuit 29 and data to activate all the transistors 37 of the driver circuit 36 is supplied as the data signal DATA. The measurement results are stored in a data file. At this time, the average of all the output currents may be stored.

Subsequently, a first combination of the light emitting diodes 7 and the circuit devices 8 whose characteristics are thus measured will be described with reference to FIG. 8. In this figure, the axis of abscissa plots the light quantity ranks of the light emitting diodes 7. For example, for a total of 1000 light emitting diodes 7, the light quantities of the light emitting diodes 7 obtained when they are driven by a current of 10 mA are divided into A to V ranks each corresponding to 3%. The light quantity is the smallest in the A rank and increases in the order of A to V.

The axis of ordinates plots the average luminances of the light emitting portions 13 of the light emitting diodes 7 obtained when the light emitting portions 13 are driven by a current of a predetermined value. The unit is μW/dot.

a to i represent output ranks of the circuit device 8. For example, for a total of 1000 circuit devices 8, the outputs (driving currents) of the circuit devices 8 obtained when a predetermined current is inputted thereto are divided into ranks each corresponding to 6%.

For example, it is understood that the luminance of a light emitting diode 7 in the G rank is maintained within 0.95 to 1.12 μW/dot by being used in combination with a circuit device 8 in any of the a to c ranks. At this time, the input terminals 18 and 19 are opened in the selecting circuit 17 of the circuit devices 8 and the driving current $i_2$ is set to a comparatively high value such as 5.9 mA.

Thus, the selecting circuit 17 is capable of selecting a driving current of a predetermined value (e.g. 5.9 mA) in accordance with the combination of a light emitting diode 7 (e.g. in the G rank) ranked according to the variation in light quantity and a circuit device 8 (e.g. in the a, b or c ranks) ranked according to the variation in output.

Specifically, in order to combine a light emitting diode 7 of comparative low light quantity (e.g. one in A to I ranks) and a circuit device 8 of comparative low output (e.g. one in a to d ranks), ADJ1 and ADJ2 of the selecting circuit 17 are both set to 1, 1 (i.e. opened). At this time, the driving current ratio is set to be 118% of the reference value and the luminance of the light emitting diode 7 is 0.8 to 1.15 μW/dot, i.e. 0.975 μW/dot±18%. Thus, the variation in luminance is very small compared to the prior art, so that the display quality improves.

Figure 8:
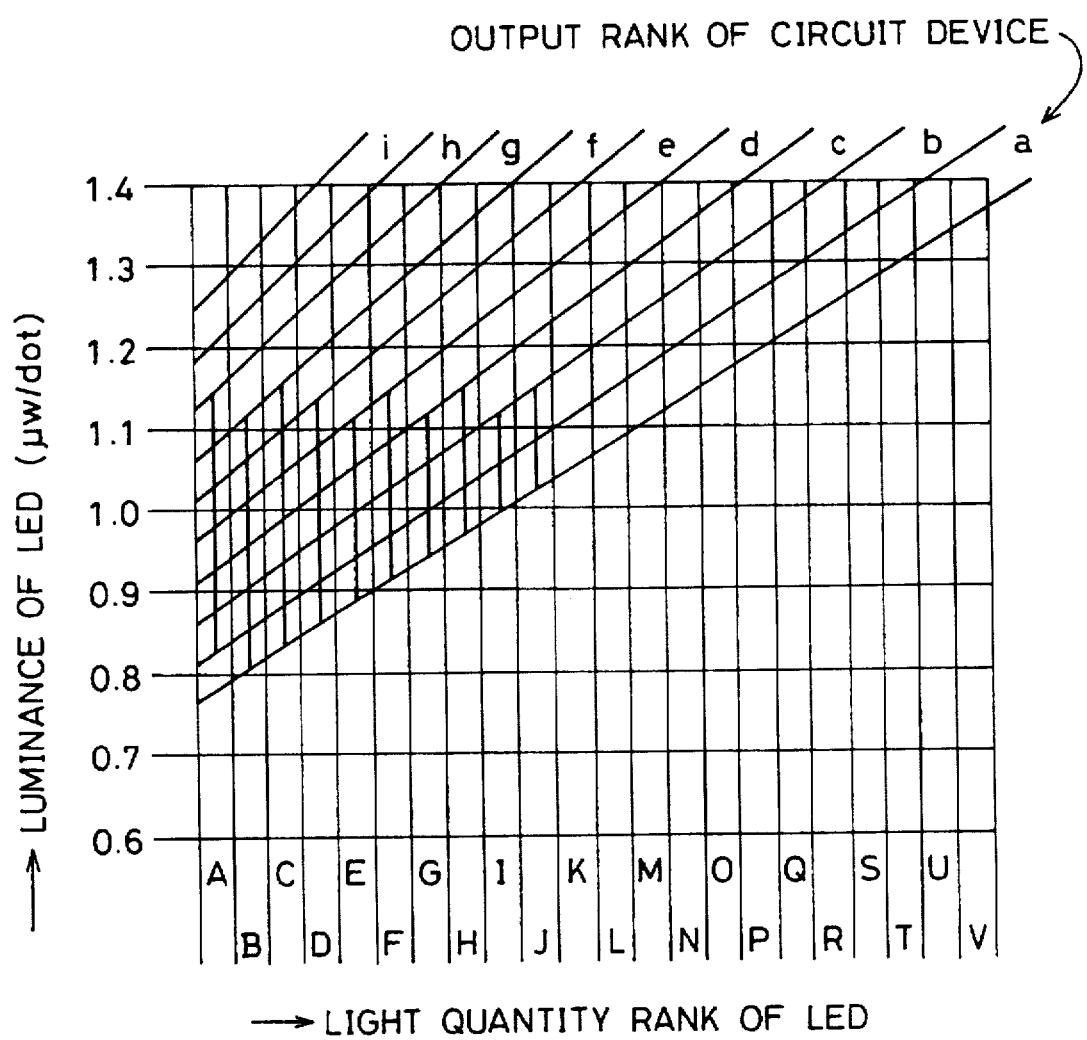
FIG. 8 shows a first example of a combination of the light emitting diode and the circuit device in the present invention.

The luminances of the light emitting diodes 7 are always maintained within a predetermined value (0.975 μW/dot±18%) by precisely making the combination of the light emitting diodes 7 and the circuit devices 8 located in the area shown by the longitudinal lines in FIG. 8 and the setting (1, 1) of the selecting circuit 17.

Figure 9:
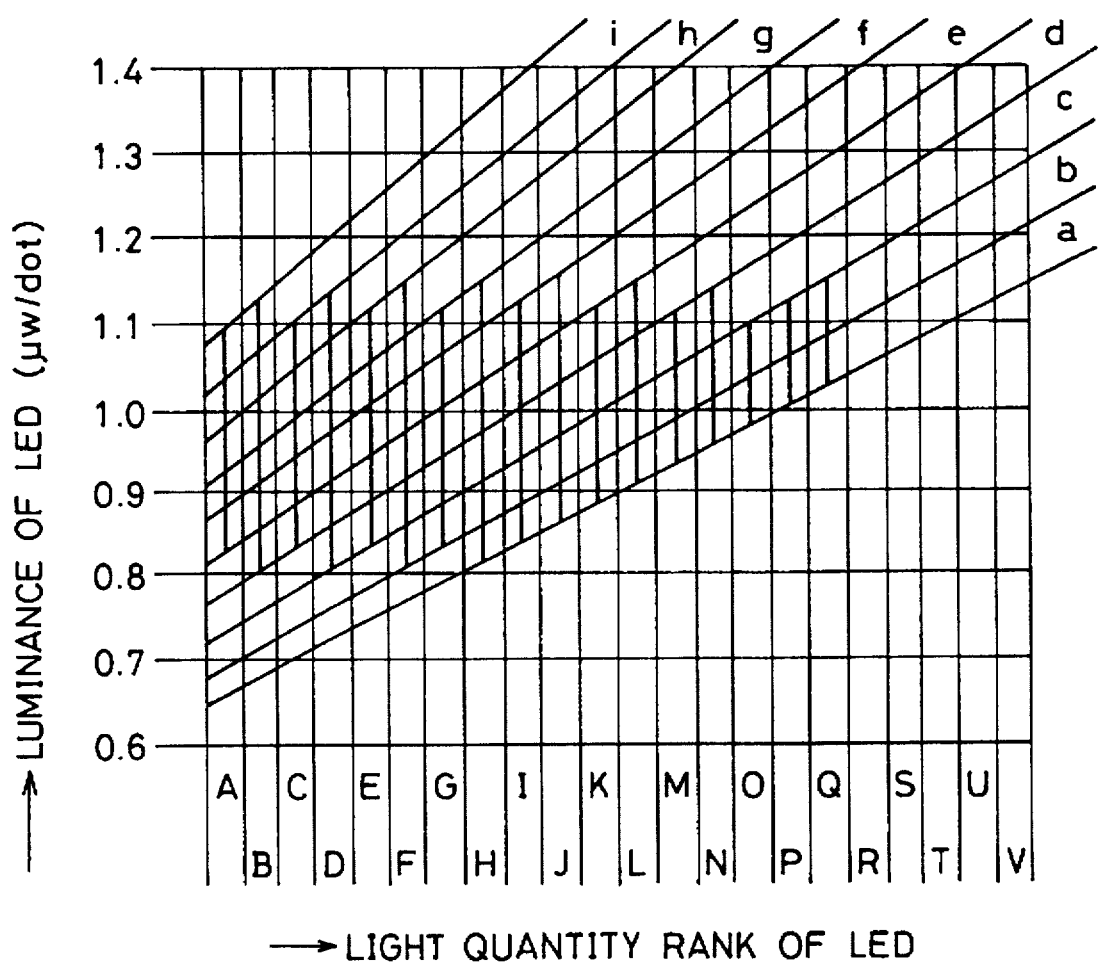
FIG. 9 shows a second example of a combination of the light emitting diode and the circuit device in the present invention.

Further, for a second combination shown in FIG. 9, compared to the combination of FIG. 8, the light emitting diodes 7 of up to an approximately intermediate light quantity may be used and the circuit devices 8 substantially in all the ranks may be used. Although this combination cannot be used for combining the devices 7 and 8 in low ranks, the combination in low ranks is realized by the combination of FIG. 8.

Specifically, ADJ1 and ADJ2 of the selecting circuit 17 are both set to 0, 0 (i.e. connected by the fine metallic wires 26 and 27) in the combination of FIG. 9. At this time, the driving current ratio is set to 106% of the reference value and the luminances of the light emitting diodes 7 are 0.975 μW/dot±18%.

Figure 10:
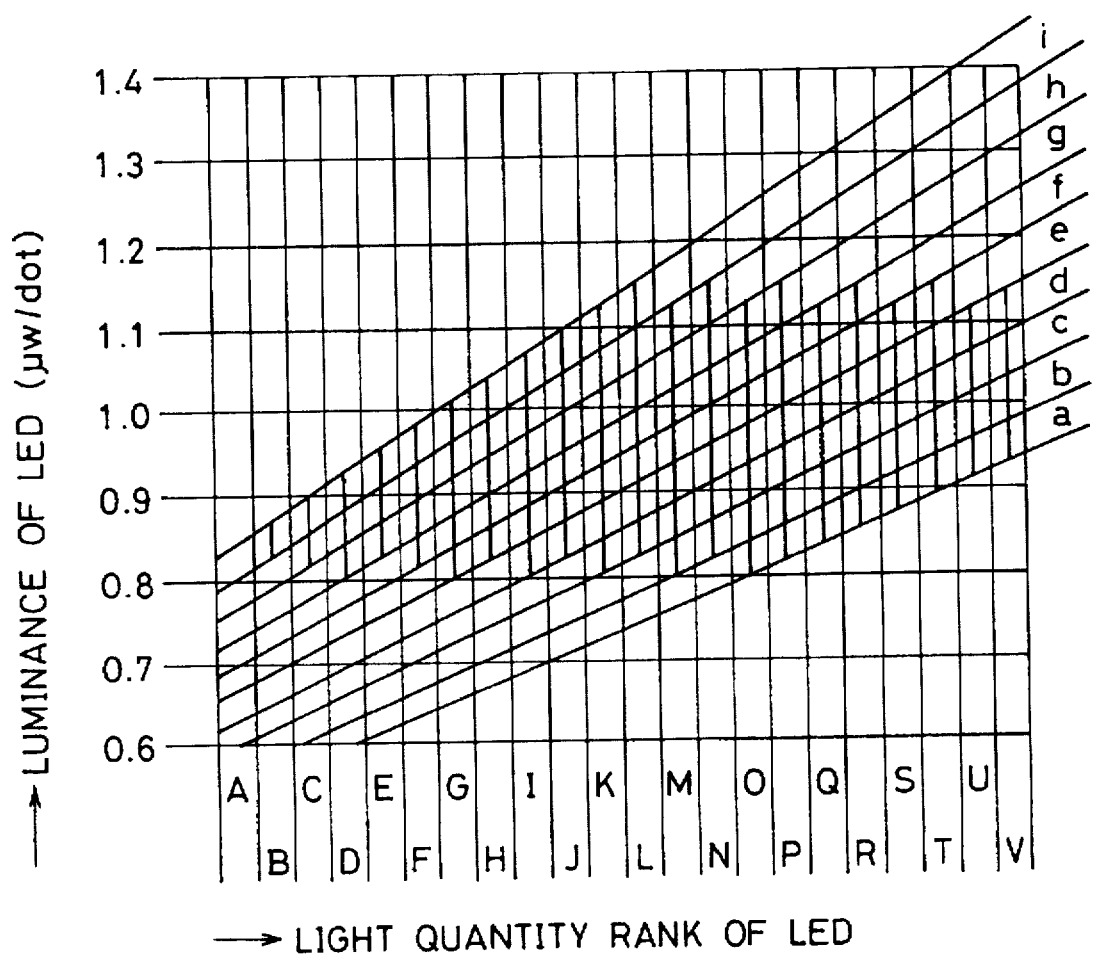
FIG. 10 shows a third example of a combination of the light emitting diode and the circuit device in the present invention.

Referring to FIG. 10, a third combination shown in this figure is suitable for light emitting diodes 7 of comparatively large light quantity compared to the combinations of FIGS. 8 and 9. This combination may be used for light emitting diodes 7 of large light quantity and circuit devices 8 substantially in all the output ranks. This combination, however, cannot be used for combining devices 7 and 8 in high ranks. Specifically, ADJ1 of the selecting circuit 17 is set to 1 and ADJ2 thereof is set to 0. At this time, the driving current ratio is set to 70% of the reference value and the luminances of the light emitting diodes 7 are 0.975 μW/dot±18%.

Figure 11:
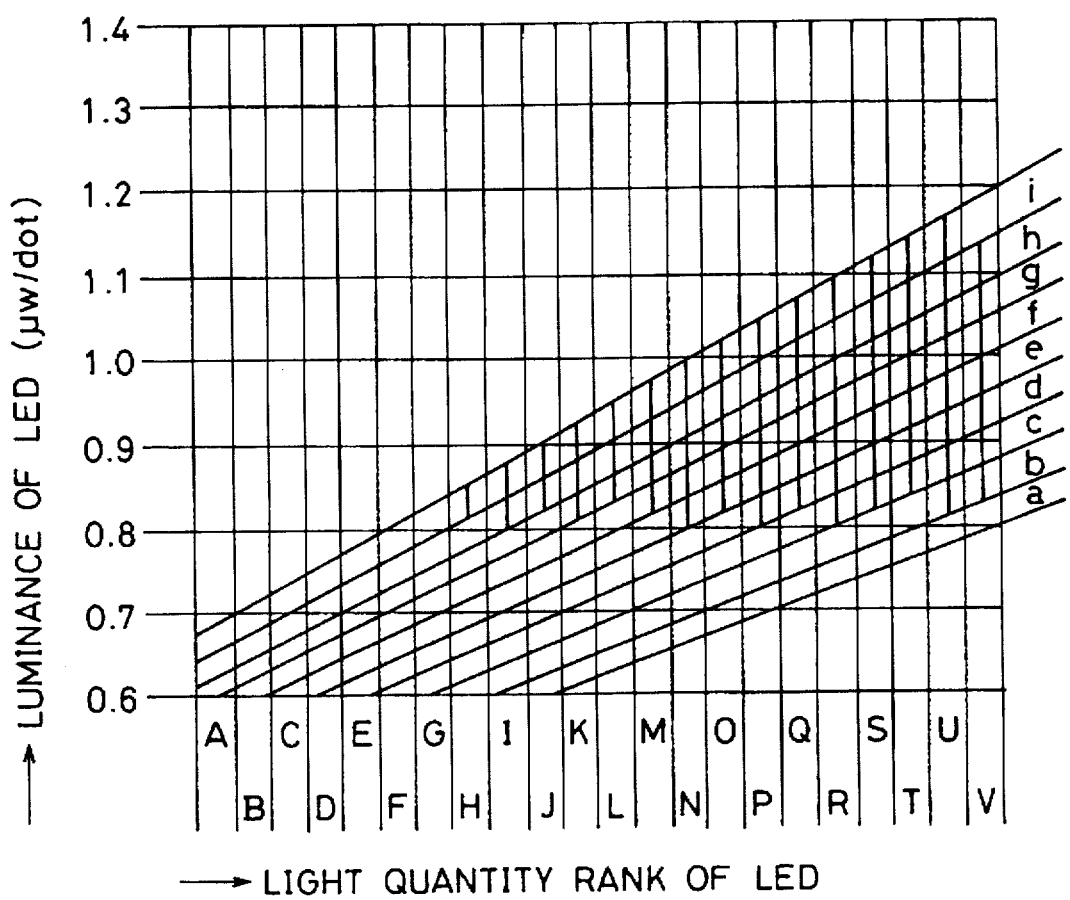
FIG. 11 shows a fourth example of a combination of the light emitting diode and the circuit device in the present invention.

Further, a fourth combination shown in FIG. 11 is suitable for light emitting diodes 7 of large light quantity and circuit devices 8 of high output compared to the combination of FIG. 10. Specifically, ADJ1 of the selecting circuit 17 is set to 0 and the ADJ2 thereof is set to 1. At this time, the driving current ratio is 52% of the reference value and the luminances of the light emitting diodes 7 are 0.975 µW/dot±18%.

As described above with reference to FIGS. 8 to 11, the present invention is characterized in that the driving current $i_2$ is selected by the selecting circuit 17 according to the combination of the light emitting diodes 7 divided into the A to V ranks according to the variation in light quantity and the circuit devices 8 divided into the a to i ranks according to the variation in output. With this, the luminance variation of the light emitting diodes 17 is maintained within ±18%.

Further, since various combinations of the light emitting diodes 7 divided into the ranks and the circuit devices 8 divided into the ranks may be used as described above, the devices 7 and 8 in almost all the ranks may be used. As a result, the yield is excellent and the cost is low.

By combining the light emitting diodes 7 and the circuit devices 8 in the areas shown by the longitudinal lines of FIGS. 8 to 11 and making setting suitable therefor by the selecting circuit 17, the luminances of the light emitting diodes 7 are precisely maintained within the predetermined value 0.975 µW/dot±18%. Consequently, since it is unnecessary to repeat the luminance measurement, the manufacture is easy. While in this embodiment, the light emitting diodes 7 are divided into 22 ranks each corresponding to 3%, the circuit devices 8 are divided into 9 ranks each selecting to 6%, the selecting circuit 17 makes four types of settings and the luminances of the light emitting diodes 7 are the average value ±18%, the present invention is not limited to these numbers and values.

While in the above-described display apparatus 12, an optical print head having a plurality of light emitting diodes 7 and a plurality of circuit devices 8 is shown as an example, the present invention is not limited thereto. The present invention is employable for a display apparatus having a single light emitting diode 7 and a single circuit device 8 and the display quality may be improved by decreasing the variation in luminance among display apparatuses.

Figure 12:
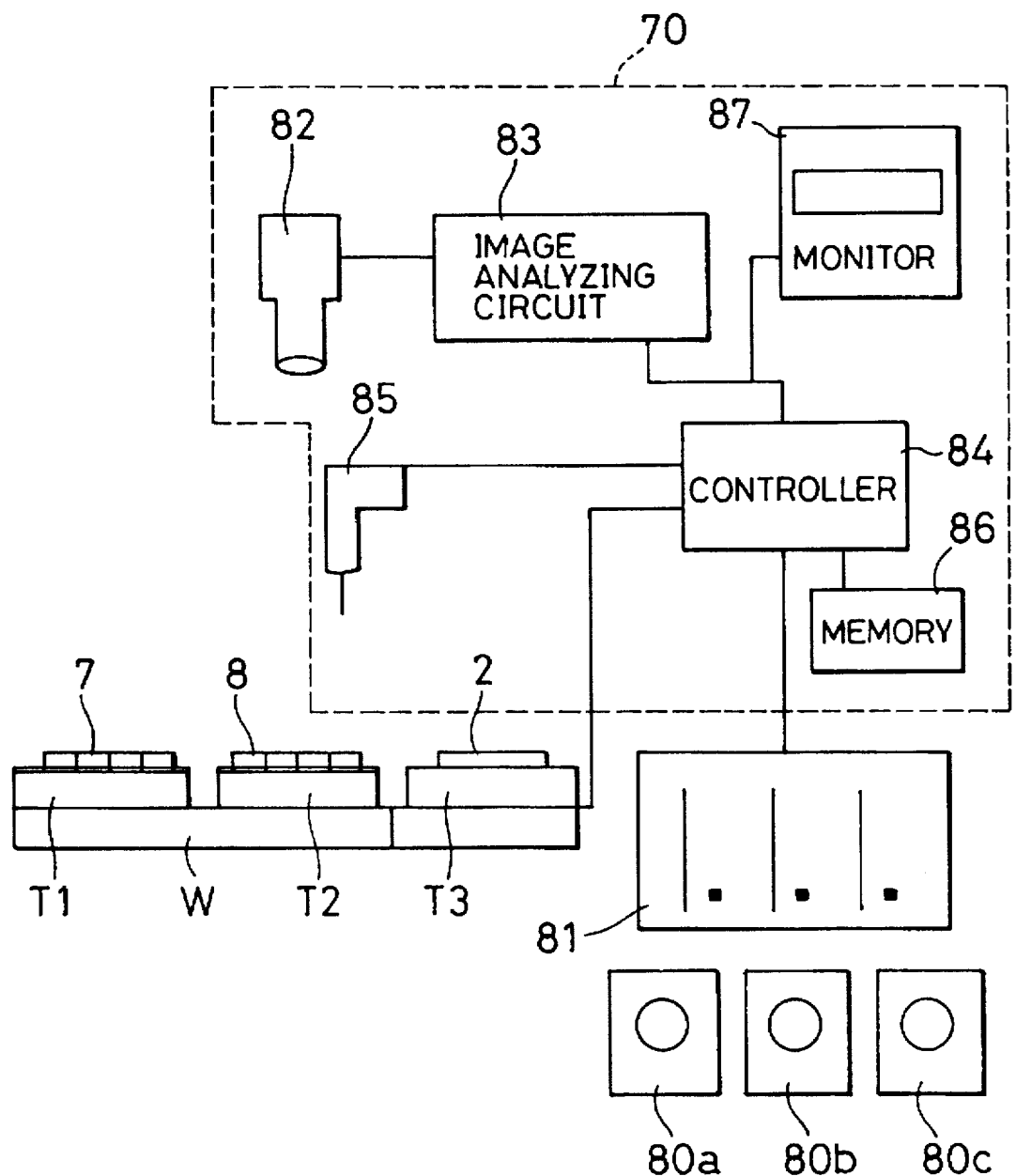
FIG. 12 shows an apparatus for assembling the display apparatus of the present invention.

Referring to FIG. 12, there is shown an automatic assembling apparatus which attaches a combination of the light emitting diode 7 and the circuit device 8 onto the circuit board 2. A plurality of light emitting diodes 7 are equally spaced on an XY table T1 on a work table W. As the work table W, one which conveys three XY tables T1, T2 and T3 into a work area is shown as an example. After the XY tables are set at reference positions, their movement amounts along the X and Y axes are automatically measured and the position coordinate data are transmitted to a subsequently-described controller 84 at a predetermined timing. Reference designations 80a, 80b and 80c represent data files comprising, for example, floppy disks. The data file 80a stores data of the measured light quantities of the light emitting diodes 7. The data file 80b stores position data of the aligned light emitting diodes 7 obtained through calculations in the form of X and Y coordinates. The data file 80c stores data of the measured output currents of the circuit devices 8 in the form of digital data. The recording and reproduction of the data in theses data files are performed by a disk drive 81. A plurality of circuit devices 8 are aligned on the XY table T2 like the light emitting diodes 7. The characteristics of their output currents are stored in the data file 80c together with the information on their positions. The data files 80a and 80c do not store the light quantities and the output currents as they are but store the previously-described characteristic ranks.

Placed on the XY table T3 is the circuit board 2 such as a printed circuit board for the display apparatus. A selected light emitting diode 7 is taken out from the first XY table T1 and mounted on the circuit board 2. Then, a circuit device 8 selected to be combined with the selected light emitting diode 7 is taken out from the second XY table T2 and mounted on the circuit board 2.

An assembler 70 includes a camera 82 for pattern recognition of the contour of the light emitting diode 7, an image analyzing circuit 83 which analyzes the output images of the camera 82, a mounter 85 which picks up the selected diode 7 and circuit device 8 from the tables T1 and T2 to mount them on the circuit board 2, and a controller 84 comprising a microprocessor which controls the data in the data files 80a, 80b and 80c, the camera 82, the image analyzing circuit 83 and the mounter 85. The image analyzing circuit 83 has a monitor 87 connected thereto. The controller 84 not only receives data from the disk drive 81 but also controls the disk drive 81 or controls the work table W and the XY tables T1, T2 and T3. Annexed to the controller 84 is a memory 86 which stores data (e.g. tables of FIGS. 8 to 11) for selecting a combination of the light emitting diode 7 and the circuit device 8 based on the light quantity data file 80a and the circuit device data file 80c. The annexation of the memory 86 facilitates the specification and change of combination condition of the light emitting diode 7 and the circuit device 8 for each type of light emitting diode products. Selection values (for the selecting circuit 17) in accordance with various combinations of the light emitting diodes 7 and the circuit devices 8 may be stored in the memory 86 so that after controlling the mounter 85 and the XY tables to mount a light emitting diode 7 and a circuit device 8 on the circuit board 2, the controller 84 may control the connection between the terminals 18 and 20 and the connection between the terminals 19 and 21 according to the characteristics of the pair of the light emitting diode 7 and the circuit device 8.

As described above, according to the present invention, a predetermined driving current is selected according to the combination of the light emitting diodes ranked according to the variation in light quantity and the circuit devices ranked according to the variation in output, so that a luminance with little variation is obtained by regulating the driving current according to the combination. In addition, a predetermined luminance is maintained by increasing the driving current for the combination of a small light quantity light emitting diode and a low output circuit device or by decreasing the driving current for the combination of a large light quantity light emitting diode and a high output circuit device. Thus, since light emitting diodes in almost all the ranks and circuit devices in almost all the ranks may be used, the yield improves.

Preferably, by selecting a driving current according to the tables showing the luminances of light emitting diodes for various combinations of light emitting diodes, circuit devices and driving currents, an appropriate driving current is selected without any trial and error, so that a substantially constant luminance is obtained.

Further preferably, in order to obtain a desired driving current, a predetermined combination of the input terminals are connected by the fine metallic wires, so that the luminance is easily adjusted.

Obviously, many modifications and variations of the present invention are possible in light of the above teachings. It is therefore to be understood that within the scope of the appended claims, the invention may be practiced other than as specifically described.

What is claimed is:

1. A method for manufacturing a display apparatus comprising a display device, a circuit device which supplies a driving current to the display device and selecting means for regulating the drive current of the circuit device into one of a plurality of steps of current values, the method comprising the steps of:

allocating the display device to one of a plurality of ranks according to its light quantity characteristic;

allocating the circuit device to one of a plurality of ranks according to its output current characteristic; and selecting based on the rank of the display device and the rank of the circuit device a selection value of the selecting means previously prepared according to a combination of ranks of the display device and the circuit device.

2. A manufacturing method according to claim 1, wherein the display device and the circuit device are mounted on a circuit board, and wherein the selecting means has a first terminal provided in the circuit device and a second terminal provided on the circuit board adjacently to the first terminal, and wherein the selection value is determined according to whether the first terminal or the second terminal is connected.

3. A manufacturing method according to claim 1, wherein the display device has a plurality of light emitting portions, and wherein an average of light quantities of the plurality of light emitting portions is ranked.

4. A manufacturing method according to claim 1, wherein the rank of the display device and the rank of the circuit device are stored in storing means, and wherein by using the data stored in the storing means, a microprocessor automatically selects a predetermined combination of the display device and the circuit device.

5. A manufacturing method according to claim 4, wherein the microprocessor controls a selection made by the selecting means of a selected circuit device.

6. A manufacturing method according to claim 1, wherein the display device is a light emitting diode.

7. A display apparatus comprising a display device, a circuit device which supplies a driving current to the display device and selecting means for regulating the drive current of the circuit device into one of a plurality of steps of current values, wherein the display device allocated to one of a plurality of ranks according to its light quantity characteristic is connected to the circuit device allocated to one of a plurality of ranks according to its output current characteristic, and wherein a selection value of the selecting means is selected based on a combination of the rank of the display device and the rank of the circuit device from among a plurality of selection values previously prepared based on combinations of the ranks of the display device and the ranks of the circuit device, the selected selection value being set.

* * * * *